United States Patent
Lundy et al.

(10) Patent No.: US 6,248,506 B1
(45) Date of Patent: Jun. 19, 2001

(54) AQUEOUS DEVELOPING SOLUTIONS FOR REDUCED DEVELOPER RESIDUE

(75) Inventors: Daniel E. Lundy, Pomona; Robert Barr, Laguna Niguel, both of CA (US)

(73) Assignee: Nichigo-Morton, Ogaki (JP)

( * ) Notice: Subject to any disclaimer, the term of this patent is extended or adjusted under 35 U.S.C. 154(b) by 0 days.

(21) Appl. No.: 09/205,013

(22) Filed: Dec. 4, 1998

(51) Int. Cl.$^7$ .................................................. G03F 7/32
(52) U.S. Cl. ...................... 430/329; 430/325; 430/331; 430/493
(58) Field of Search .................................. 430/325, 329, 430/331, 493

(56) References Cited

U.S. PATENT DOCUMENTS

| | | | |
|---|---|---|---|
| 4,329,422 | * 5/1982 | Langlais | 430/331 |
| 4,370,406 | * 1/1983 | Jones | 430/331 |
| 5,122,438 | * 6/1992 | Nogami | 430/303 |
| 5,364,736 | 11/1994 | Eramo, Jr. et al. | 430/280 |
| 5,393,643 | 2/1995 | Lundy et al. | 430/281 |
| 5,576,145 | 11/1996 | Keil et al. | 430/281.1 |
| 5,609,991 | 3/1997 | Briguglio et al. | 430/281.1 |
| 5,922,522 | * 7/1999 | Barr | 430/493 |
| 6,063,550 | * 5/2000 | Lundy | 430/331 |

OTHER PUBLICATIONS

Ser. No. 09/069,517, filed Apr. 29, 1998, Robert Barr and Daniel E. Lundy.
Ser. No. 09/069,518, filed Apr. 29, 1998, Robert Barr and Daniel E. Lundy.

* cited by examiner

*Primary Examiner*—Mark F. Huff
*Assistant Examiner*—Nicole Barreca

(57) ABSTRACT

An alkaline aqueous developing solution for developing photoresists or the like contains, as an anti-scum agent:

A) between about 0.05 and about 1.0 wt % of a first surfactant or surfactant mixture, the first surfactant(s) having the general formula:

$$R—O—(AO)_n—H$$

where AO are alkylene oxide units selected from ethylene oxide units ($CH_2—CH_2—O$) and propylene oxide units ($CH(CH_3)—CH_2—O$) or ($CH_2—CH(CH_3)—O$) and mixtures of ethylene and propylene oxide units, either in the mixture of molecules, where R is a hydrophobic group, n is between about 8 and about 200, and B) as a second surfactant, between about 0.05 and 1.0 wt % of an organic salt having the formula:

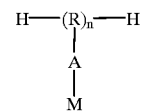

where R is an alkyl or aryl group, preferably phenyl,

A is selected from carboxyl, sulfonyl, phosphonyl and mixtures thereof, preferably sulfonyl.

M is a charge-balancing cation, and n is between 1 and about 200, preferably between 2 and about 100.

the weight ratio of A) to B) being between about 1:5 and about 5:1.

16 Claims, No Drawings

AQUEOUS DEVELOPING SOLUTIONS FOR REDUCED DEVELOPER RESIDUE

The present invention is directed to alkaline aqueous development solutions such as are used to develop photoresists.

BACKGROUND OF THE INVENTION

In the process of manufacturing printed circuit boards, UV curable photoresist are used. The exposed portion of the photoresist becomes insoluble in developer solution (dilute alkaline solution) and forms a protective barrier to other processing chemicals (for example, etching and plating solutions). The unexposed portion of the photoresist needs to rinse freely from the circuit board with a mild alkaline solution (for example, 1% sodium carbonate, monohydrate in water). The development occurs because the polymer in the photoresist contains acid functionality. These acid groups within the organic polymer matrix are neutralized in alkaline solution forming a water miscible organic salt. As the photoresist builds up in solution (called developer loading), insoluble organic materials begin to form in the developing tank, eventually forming a water insoluble scum or residue. The presence of anti-foam additives (conventionally added to developing solutions to minimize foaming) greatly increases the tendency for scum to form. As the level of scum builds, chances increase for an inadvertent redeposit of these water insoluble residues onto the developed circuit board. These redeposited residues cause a retardation of the etching solution (etching chemistries have difficulty penetrating any organic residues). Where the etch is retarded, circuit shorts form causing a defective circuit board. In addition to increasing the potential for defective circuit boards, this residue also makes it difficult to clean equipment increasing maintenance time.

Accordingly, it is a primary object of the present invention to provide developing solutions in which the build-up of scum and residue is reduced.

SUMMARY OF THE INVENTION

In accordance with the invention, alkaline aqueous developing solutions, containing between about 0.1 and about 3.0 wt % of a base, are improved by the addition of A) between about 0.05 and about 1.0 wt % of a first surfactant or surfactant mixture, the first surfactant(s) having the general formula:

$$R\text{—}O\text{—}(AO)_n\text{—}H \qquad (I)$$

where AO are alkylene oxide units selected from ethylene oxide units ($CH_2$—$CH_2$—O) and propylene oxide units ($CH(CH_3)$—$CH_2$—O) or ($CH_2$—$CH(CH_3)$—O) and mixtures of ethylene and propylene oxide units, either in the mixture of molecules, where R is a hydrophobic group, typically a hydrocarbon group, n is between about 8 and about 200, preferably between about 15 and about 40, and B) as a second surfactant, between about 0.05 and about 1.0 wt % of an organic salt, the weight ratio of A) to B) being between about 1:5 and about 5:1, preferably in the range of 1:1, said organic salt having the formula:

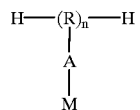

where

R is an alkyl or aryl group, preferably phenyl,

A is selected from carboxyl, sulfonyl, phosphonyl and mixtures thereof, preferably sulfonyl, M is a charge-balancing cation, and n is between 1 and about 200, preferably between 2 and about 100.

The developing solution may also contain an anti-foam agent, e.g., at between about 0.01 and about 1.0 wt %.

DETAILED DESCRIPTION OF CERTAIN PREFERRED EMBODIMENTS

Aqueous developing solutions to which the present invention generally applies are well known for developing photoresist compositions, both primary photoresists and photoresists which are intended to form hard permanent layers, such as are suitable for solder masks. Examples of such photoresists and the alkaline aqueous development solutions are found, for example, in U.S. Pat. Nos. 5,576,145, 5,609,991, 5,393,643, and 5,364,736, the teachings of each of which are incorporated herein by reference.

The photoresist compositions vary in composition, but typically such photoresist compositions comprise A) between about 20 and about 80 wt % of a binder polymer having an acid number between about 40 and about 250, B) between about 15 and about 50 wt % of α,β-ethylenically unsaturated compounds, typically monomers and short-chain oligomers, and C) between about 0.1 and about 25 wt % of a photoinitiator or photoinitiator chemical system, these weight percentages being based on total weight of A) plus B) plus C).

Typically, the alkaline aqueous solution is a solution of sodium carbonate, e.g., 1% sodium carbonate monohydrate. However, other bases, such as NaOH, KOH, triethanolamine, potassium carbonate etc. may be used to provide the alkalinity necessary for developing photoresists of this type. The alkalinity of the developing solution forms salts with the acid functionality of the binder polymer, typically carboxylic acid functionality, rendering the binder polymer miscible in the alkaline aqueous solution. Thus, photoresists of this type are applied as a layer to a substrate, exposed to patterned actinic radiation, and developed in alkaline aqueous solution which washes away non-exposed, un-polymerized portions of the photoresist layer.

Alkoxylated emulsifiers A) in accordance with the invention, in particular an emulsifier with a tristyrylphenol hydrophobe proved effective, by itself in reducing oily residues. However, large amounts of sinking residues were present. By adding an organic salt B), such as a phenolic sulfonyl salt, to the mixture, the solid residues were eliminated. By itself, a phenolic, sulfonyl salt did not reduce the floating scum. Therefore, this combined synergistic mixture of emulsifiers A) and B) is useful for elimination of all photoresist residues. A weight ratio of A) to B) of about 1:1 appears to be optimal.

In the preferred alkoxylated emulsifier (R of formula (I)), the hydrophobe is tristyrylphenol. Such emulsifiers are sold as Soprophor® BSU and Soprophor® S/40-P having the chemical formula

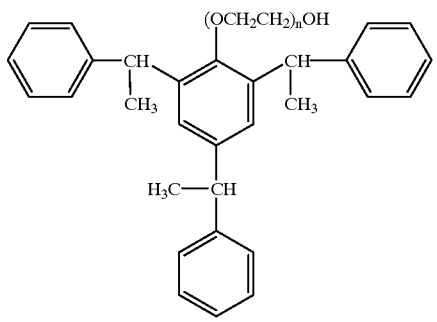

for Soprophor® BSU, n=16; for Soprophor® s/40-P, n=40.

A suitable organic salt is a phenolic sulfonyl salt which is sold as Newkalgen® TX-C and has the formula:

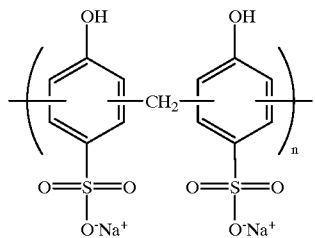

(n is not specified specified by the manufacturer but is believed to be in the range of 2 to 100).

The cation may be any suitable charge-balancing cation, such as potassium, lithium, ammonium, magnesium, calcium, cesium, etc.

The alkaline aqueous solution may also contain an antifoam agent, such as that sold as Antifoam 80 by Morton International.

The invention will now be described in greater detail by way of specific example.

EXAMPLE

Emulsifier Mixtures

Mixture of ionic and nonionic Emulsifiers

Total Emulsifier Additions (2000 ppm) to MORTON 2750 ANTIFOAM™ (500 ppm)

(5.4 grams of ProEtch ® 1230 added to 300 ml of Sodium Carbonate, Monohydrate)

| Nonionic Component | Moles of ethylene oxide | % of Mixture | Ionic Component | % of Mixture | Solid/ Sinking Scum | Floating/ Oily Scum |
|---|---|---|---|---|---|---|
| Soprophor ® BSU/40-P | 15–40 | 100% | — | — | Heavy | None |
| — | — | — | Newkalgen ® TX-C | 100% | Very Slight | Heavy |
| Soprophor ® BSU/40-P | 15–40 | 50% | Newkalgen ® TX-C | 50% | None | None |

It can be seen that the combination of surfactants in accordance with the invention acts to reduce both floating and sinking residues. (ANTIFOAM 80 and MORTON 2750 ANTIFOAM are both antifoam additives used to minimize scum or residue.)

What is claimed is:

1. An alkaline aqueous developing solution comprising between about 0.1 and about 3.0 wt % of a base, the improvement wherein said developing solution comprises:

(A) between about 0.05 and about 1.0 wt % of a first surfactant having the general formula I:

R—O—(AO)$_n$—H where AO are alkylene oxide units selected form ethylene oxide units (CH$_2$—CH$_2$—O) and propylene oxide units (CH(CH$_3$)—CH$_2$—O) or (CH$_2$—CH(CH$_3$)—O and mixtures of ethylene and propylene oxide units, where R is a hydrophobic group, n is between 8 and 200, and (B) as a second surfactant, between about 0.05 and about 1.0 wt % of an organic salt having the formula:

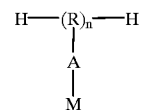

where R is an allyl or aryl group,
A is a sulfonyl group,
M is a charge-balancing cation, and
n is between 1 and 200,
the weight ratio of A) to B) being between about 1:5 and about 5:1.

2. The solution according to claim 1 wherein n of formula I is at least 10.

3. The solution according to claim 1 wherein R of formula I is a hydrocarbon group.

4. The solution according to claim 1 wherein R of formula I is tristyrylphenol.

5. The solution according to claim 1 further comprising between about 0.01 and about 1.0 wt % of an anti-foam agent.

6. The solution according to claim 1 wherein R of the organic salt is phenyl.

7. The solution according to claim 1 wherein n of the organic salt is between 2 and 100.

8. The solution according to claim 1 wherein in said organic salt, R is phenyl, and n is between 2 and 100.

9. A method of preparing a patterned photoresist pattern on a substrate comprising providing a layer of a photoresist to a substrate, said photoresist comprising an acid functional binder polymer and photopolymerizable compounds, exposing said layer of photoresist to patterned actinic radiation, and developing said photoresist layer in an alkaline aqueous developing solution comprising between about 0.1 and about 3.0 wt % of a base and A) between about 0.05 and about 1.0 wt % of a first surfactant having the general formula I:

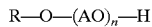

where AO are alkylene oxide units selected from ethylene oxide units ($CH_2$—$CH_2$—O) and propylene oxide units ($CH(CH_3)$—$CH_2$—O) or ($CH_2$—$CH(CH_3)$—O) and mixtures of ethylene and propylene oxide units, where R is a hydrophobic group, n is between 8 and 200, and B) as a second surfactant, between about 0.05 and 1.0 wt % of an organic salt having the formula:

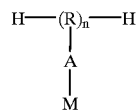

where
- R is an alkyl or aryl group,
- A is a sulfonyl group,
- M is a charge-balancing cation, and
- n is between 1 and 200, the weight ratio of A) to B) being between about 1:5 and about 5:1.

10. The method according to claim 9 wherein n of formula I is at least 10.

11. The method according to claim 9 wherein R of formula I is a hydrocarbon group.

12. The method according to claim 9 wherein R of formula I is tristyrylphenol.

13. The method according to claim 9 wherein said solution further comprises between about 0.01 and about 1.0 wt % of an anti-foam agent.

14. The method according to claim 9 wherein R of the organic salt is phenyl.

15. The method according to claim 9 wherein n of the organic salt is between 2 and 100.

16. The method according to claim 9 wherein in said organic salt, R is phenyl, and n is between 2 and 100.

* * * * *